US008543959B2

(12) United States Patent
Carpenter et al.

(10) Patent No.: US 8,543,959 B2
(45) Date of Patent: Sep. 24, 2013

(54) BONDING CONTROLLER GUIDED ASSESSMENT AND OPTIMIZATION FOR CHIP-TO-CHIP STACKING

(75) Inventors: Gary Dale Carpenter, Austin, TX (US); Alan James Drake, Austin, TX (US); Eren Kursun, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 13/087,464

(22) Filed: Apr. 15, 2011

(65) Prior Publication Data

US 2012/0266125 A1    Oct. 18, 2012

(51) Int. Cl.
*G06F 17/50*  (2006.01)
(52) U.S. Cl.
USPC ............ 716/132; 716/113; 716/136; 716/138
(58) Field of Classification Search
USPC .................................. 716/113, 132, 136, 138
See application file for complete search history.

(56) References Cited

U.S. PATENT DOCUMENTS

| 2008/0141210 | A1* | 6/2008 | Fredrickson et al. ............ 716/18 |
| 2010/0031376 | A1  | 2/2010 | Bartley et al. |
| 2010/0060310 | A1* | 3/2010 | Laisne et al. .................... 326/10 |
| 2010/0153043 | A1  | 6/2010 | Su et al. |
| 2010/0213600 | A1  | 8/2010 | Lau et al. |
| 2010/0332177 | A1  | 12/2010 | Wu et al. |
| 2011/0084314 | A1* | 4/2011 | Or-Bach et al. ................ 257/209 |
| 2011/0131391 | A1* | 6/2011 | Barowski et al. ................ 712/12 |
| 2011/0286190 | A1* | 11/2011 | Kursun et al. .................. 361/783 |
| 2011/0302582 | A1* | 12/2011 | Jacobson et al. .............. 718/102 |
| 2012/0105144 | A1* | 5/2012 | Barowski et al. ............. 327/565 |
| 2012/0112776 | A1* | 5/2012 | Cher et al. ............... 324/750.05 |

FOREIGN PATENT DOCUMENTS

| JP | 02003167929 A | 6/2003 |
| TW | 373282 A | 11/1999 |
| WO | 2010110244 A1 | 9/2010 |

OTHER PUBLICATIONS

Chuan Xu et al, "Compact AC Modeling and Performance Analysis of Through-Silicon Vias in 3-D ICs", Dec. 2010.

* cited by examiner

*Primary Examiner* — Naum Levin
(74) *Attorney, Agent, or Firm* — Garg Law Firm, PLLC; Rakesh Garg; John Flynn (57) ABSTRACT

A method, system, and computer program product for performance-based chip-to-chip stacking are provided in the illustrative embodiments. A first candidate chip is selected from a set of candidate chips for stacking, each candidate chip in the set of candidate chips including an integrated circuit. A part of a 3D performance determinant is activated in the first candidate chip. A value of a performance parameter is measured for a set of operating conditions. A stacked performance value is computed for the first candidate chip using the value. A subset of the set of candidate chips is stacked in a stack, the subset including the first candidate chip, such that a combined value of the performance parameter for the subset when stacked in a first order is within a defined range of values for the performance parameter.

20 Claims, 5 Drawing Sheets

BONDING CONTROLLER GUIDED ASSESSMENT AND OPTIMIZATION FOR CHIP-TO-CHIP STACKING

RELATED APPLICATION

The present invention is related to similar subject matter of co-pending and commonly assigned U.S. patent application Ser. No. 13/156,836 entitled "INFRASTRUCTURE FOR PERFORMANCE BASED CHIP-TO-CHIP STACKING," filed on Jun. 09, 2011, which is hereby incorporated by reference.

BACKGROUND

1. Technical Field

The present invention relates generally to a method, system, and computer program product for creating integrated circuits. More particularly, the present invention relates to a method, system, and computer program product for selecting and combining separate integrated circuit chips into a stack of chips in three dimensions (3D stack) to achieve a certain performance from the stack.

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit (IC) is generally individually encased in hard plastic forming age. The components in modern day electronics generally appear to be rectangular black plastic pellets with connector pins protruding from the plastic encasement. Often, many such packages are electrically coupled so that the chips therein form an electronic circuit to perform certain functions.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry. A wire is a connection between parts of electronic components, and is formed using a metallic material that conducts electricity. A conducting path in an IC, such as a wire, is also known as a back-end macro. The set of electronic components implementing logic or a function is called a front-end macro.

An IC may use many layers of silicon to implement a circuit. In other words, components forming the circuit may be placed on different layers of silicon in a chip. Interconnects connecting the components on one layer to components on different layers go through the silicon layer. Such interconnects are also known as through silicon vias (TSVs).

In an effort to further reduce the footprint of electronic circuits, different chips are being stacked together in a single package. Stacking chips together into a common package is called chip-to-chip stacking. For example, a processor chip and a memory chip, each possibly formed using multiple layers, may be stacked to occupy a smaller area on a circuit board, or consume less power, as compared to using separate processor and memory chips.

SUMMARY

The illustrative embodiments provide a method, system, and computer program product for performance-based chip-to-chip stacking. An embodiment selects a first candidate chip from a set of candidate chips for stacking, each candidate chip in the set of candidate chips including an integrated circuit. The embodiment activates a part of a 3D performance determinant in the first candidate chip. The embodiment measures a value of a performance parameter for a set of operating conditions. The embodiment computes a stacked performance value for the first candidate chip using the value. The embodiment stacks a subset of the set of candidate chips in a stack, the subset including the first candidate chip, such that a combined value of the performance parameter for the subset when stacked in a first order is within a defined range of values for the performance parameter.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Presently, the chips that are planned for stacking are determined to be functional, such as by assuring that a known good die has been determined for the chip's design. Then, the chips are stacked to assure that they remain functional in the stack.

The invention recognizes that merely ensuring that the stacked chips remain functional or characterizing individual layers only without stack-level evaluation is not sufficient for many implementations. The performance of the stack is dependent on not only the individual functional layers but also the relationship of those layers in the stack. Because this information is not available at the manufacturing stage the stack integration is not presently optimized. For stack performance optimization the layer characteristics with respect to each other and with respect to the overall stack definition have to be optimized to yield an optimal stacking solution.

The invention recognizes, for example, that a chip's performance normally deteriorates with rising temperature. The invention also recognizes that chip-to-chip stacking causes the temperature in the vicinity of a stacked chip to rise more than when the chip is not stacked. Therefore, the invention recognizes that the same chip is likely to perform differently in stacked and unstacked (single stratum) configurations or when the stack layer ordering is changed.

As some other examples, the invention recognizes that different chips perform differently when subjected to different operating voltages, frequencies or both. When a chip is used in an unstacked configuration, a circuit may be able to supply the desired operating voltage or frequency for that chip. The invention recognizes, however, that when chips are stacked, a common operating voltage or frequency for the entire stack may not be optimal operating conditions for at least some of the chips in the chip-to-chip stack. Thus, the invention recognizes that while the chips in the stack may remain functional, their performance in the stack will deteriorate, causing unintended consequences in the circuit or elsewhere.

The invention recognizes that the chips being integrated in a chip-to-chip 3D stack may differ significantly in their specifications. For example, two chips being considered for stacking may have different operating voltage ranges with different tolerances. The differences in the specifications can in turn influence the overall stack performance. If the chips selected for stacking are not carefully selected with due regard to these differing specifications, the adverse affect on the performance of the stacked chips can void or at least significantly reduce any performance gain to be had from stacking the chips.

A critical path is an electrical path through a chip's circuit, including front-end macros and back-end interconnect components that may affect a performance metric beyond a threshold. For example, a logic component on the chip, when connected using certain back-end macros on the chip, may cause a timing delay to exceed a threshold when the chip is stacked. A 3D critical path is a path in a chip that is a critical path when the chip is stacked in a 3D stack with other chips.

Many other factors affect the performance of a 3D stack in a similar manner. Such factors are called 3D performance determinants, and a 3D critical path is an example thereof. Various embodiments are described herein using a 3D critical path only as an example 3D performance determinant without implying any limitation on the invention.

The invention further recognizes that critical paths in a 3D stack span multiple device layers. Therefore, inter-layer variation is difficult to factor in to estimate stack performance using currently available methodology for single stratum, or single chip (2D) estimation techniques.

The invention recognizes that given N individual chips from M wafers, which chip should be integrated with which other chip is a non-trivial problem. The problem becomes even more complex especially when the candidate chips for stacking number in the thousands and their stacking order and combinations are a combinatorial factor of their numbers. The invention recognizes that selecting suitable chips to integrate with other suitable chips in a suitable order of integration, when many chips exhibit variations in their specifications, is difficult to make when the objective is to improve the stack's timing performance, energy efficiency, or other performance characteristics.

Pre-stacking characterization without stack optimization is insufficient as described above, and post-stacking assessment of delay characteristics is too late for the chip-to-chip stacking decisions. Once a stacking design is committed, making changes to the stacking is expensive and complex. Therefore, the invention recognizes that the stacking selection and ordering decisions have to be enabled pre-integration.

However, the invention also recognizes that 3D-specific delay and variation characterization is limited or non-existent in current 3D stacking design flows. The invention recognizes that special infrastructure on the chips being stacks is needed to be fabricated onto the chips to enable the pre-integration assessment of 3D stack performance characteristics.

The temperature, voltage, and frequency are described above only as example operating conditions that affect the performance of chips in chip-to-chip stacks. These operating conditions are used in the disclosure to maintain clarity of the description and not as a limitation on the invention. Many operating conditions other than temperature, voltage, and frequency will be apparent from this disclosure to those of ordinary skill in the art. For example, leakage current may be another operating condition that may change as a result of chip-to-chip stacking.

The illustrative embodiments used to describe the invention generally address and solve the above-described problems and other problems related to chip-to-chip stacking. The illustrative embodiments provide a method, system, and computer program product for performance-based chip-to-chip stacking in 3D stacked integrated circuits. An embodiment uses bonding controller guided performance assessment and optimization for chip-to-chip stacking. An embodiment provides a technique that uses layer characterization data and design data for performance optimization at pre-bonding stage.

An implementation may use an embodiment with respect to less than all the chips in a contemplated stack without departing the scope of the invention. For example, an implementation may stack chips that have the infrastructure described in the related disclosure together with chips that do not. In such a case, only the chips that include the infrastructure may be assessed for 3D-stacking performance characteristics within the scope of the invention.

The illustrative embodiments are described with respect to certain ICs or circuits only as examples. Such descriptions are not intended to be limiting on the invention. For example, an illustrative embodiment described with respect to a microprocessor chip can be implemented with respect to a memory or a controller chip without departing the scope of the invention.

The illustrative embodiments are described with respect to certain data, data structures, file-systems, file names, directories, and paths only as examples. Such descriptions are not intended to be limiting on the invention. For example, an illustrative embodiment described with respect to a table and path can be implemented as a flat file, an index file, or a database within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, parameters, considerations, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
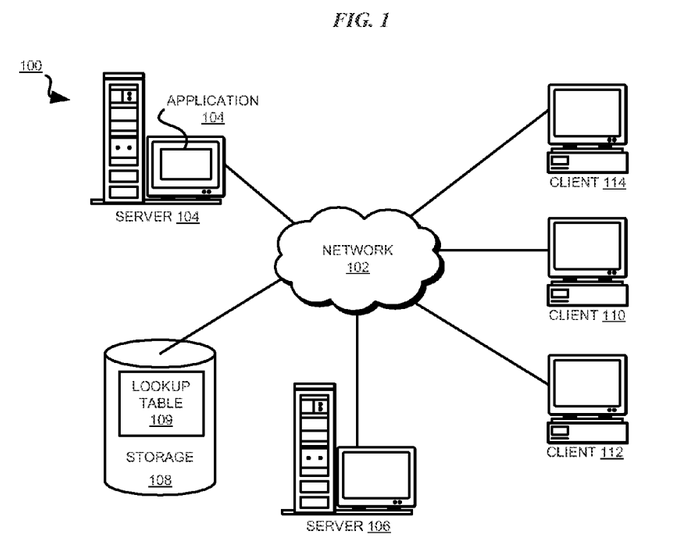
FIG. 1 depicts a pictorial representation of a network of data processing systems in which illustrative embodiments may be implemented.
Figure 2:
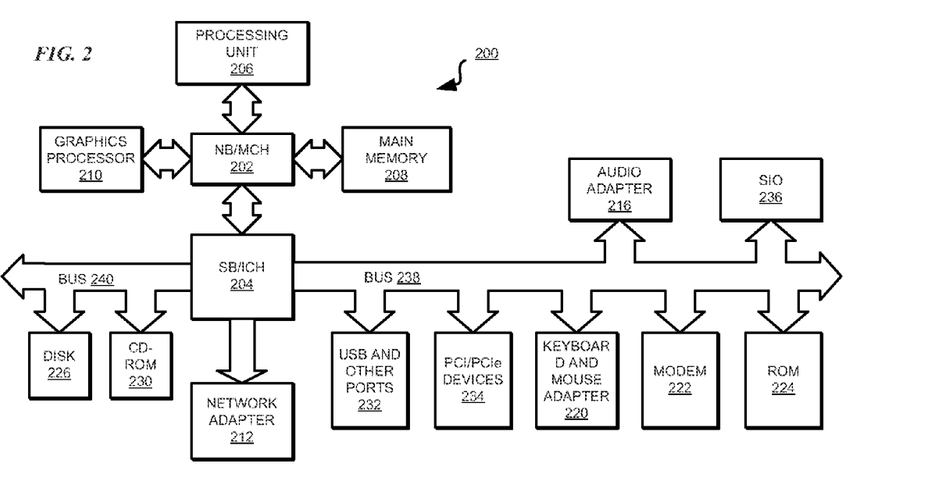
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include application 105 that may implement an embodiment. Stack table 107 may be stored in storage unit 108 or a storage device associated with server 104. Stack table 107 may be a stack table of stacking performance characterization data according to an embodiment.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
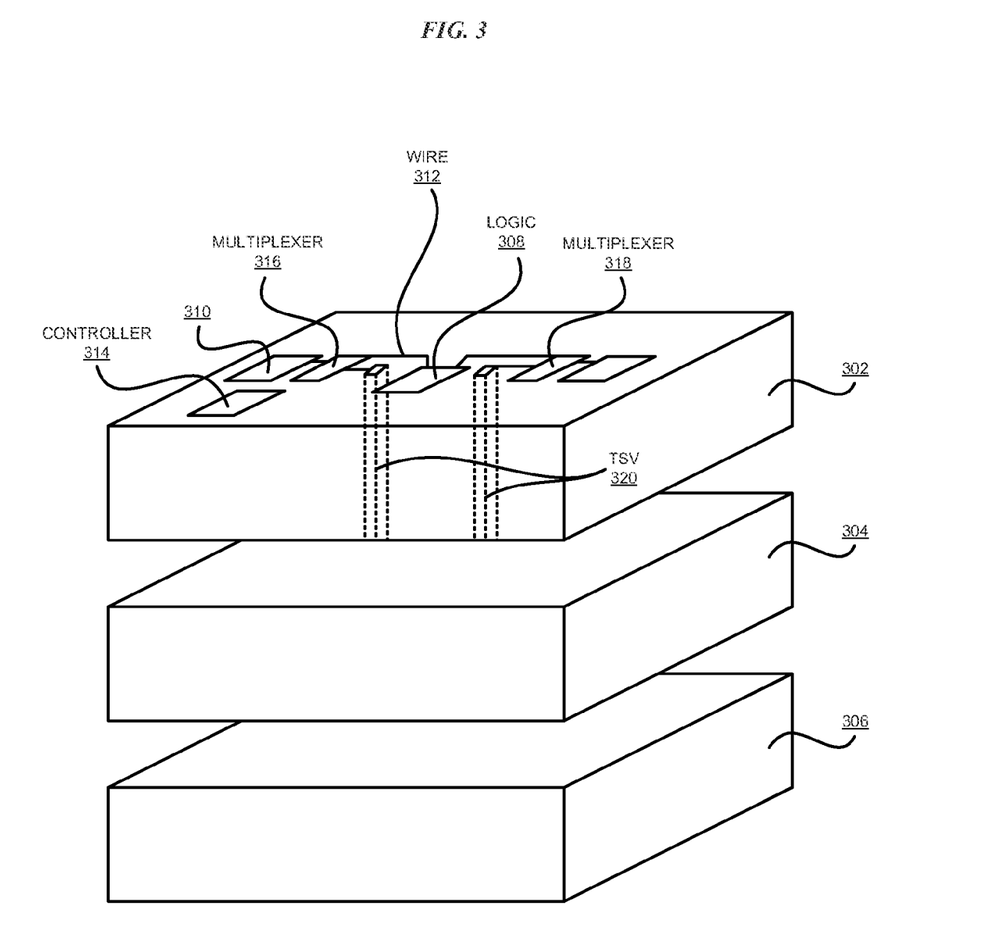
FIG. 3 depicts a block diagram of example chips in a 3D stack and including stacked performance characterization infrastructure in accordance with an illustrative embodiment.

With reference to FIG. 3, this figure depicts a block diagram of example chips in a 3D stack and including stacked performance characterization infrastructure in accordance with an illustrative embodiment. Chips 302, 304, and 306 may each be a functional chip of same or different type. Logic 308 may be a front-end macro on a 3D critical path in chip 302.

Logic 308 is coupled to other component 310 using wire 312. Logic 308 is similarly shown to be coupled to other components with wires (not labeled individually). Bonding controller 314 and multiplexers 316 and 318 are parts of the 3D stacked performance characterization infrastructure (infrastructure). TSVs 320 allow logic 308 to be coupled to other components on chips 304 and 306. Other parts of such an infrastructure may include sensors not depicted in this figure.

Bonding controller 314 and multiplexers 316 and 318 are described in greater detail elsewhere in the related disclosure. Functionally, among other operations, controller 314 and a multiplexer, such as multiplexer 316, operate to couple logic 308 with component 310 using a TSV, such as TSV 320. More precisely, bonding controller 314 can signal multiplexer 316 to activate TSV 320, to wit, use TSV 320 or a part thereof, in the 3D critical path.

As another operation, bonding controller 314, multiplexers 316 and 318, and other parts of the infrastructure, such as sensors, allow measuring one or more performance parameters when logic 308 operates in actual or simulated 3D stack. For example, TSV 320 may not be used when chip 302 operates in unstacked configuration, and used when chip 302 operates in a stack with chips 304 and 306. In other words, TSV 320 may be an example of a cross-stratum interconnect. In such a case, the infrastructure allows measuring a delay when the front-end macros in a 3D critical path include logic 308 and the back-end macros include TSV 320. As an example, an application, such as application 105 in FIG. 1, may be able to receive such a delay that combines the delays of the various components of a 3D critical path (combined delay) using the infrastructure.

As another optional operation, bonding controller 314 may compute the signals that should be sent to multiplexer 316 to activate TSV 320. Whether the signals are computed or received at controller 314, as another operation, bonding controller 314 transmits those signals to multiplexer 316 to activate TSV 320.

Note that the infrastructure allows computing combined delays of 3D critical paths without actually having to stack chip 302 with chips 304 or 306. The infrastructure is usable for collecting the combined delay or other 3D stacked performance characteristic measurement in a single stratum configuration of chip 302. Multiplexers 316 and 318 are described as activating or deactivating TSVs 320 only as an example and not as a limitation on the infrastructure or an embodiment of the invention. A multiplexer, such as multiplexer 316, in the infrastructure according to an embodiment may activate or deactivate any delay component that contributed to a combined delay, or any other component that contributed to a 3D stacked performance characteristic, in a similar manner.

Furthermore, the infrastructure including controller 314, one or more multiplexers, such as multiplexers 316 and 318, and one or more sensors, is usable in multiple modes. In one mode, the infrastructure is used in a testing mode to collect the 3D stacked performance characterization data from a given chip in single stratum configuration. In another mode, once the chips are committed in a stack, the infrastructure can be used to activate or deactivate certain delay components or other components that contribute to another performance parameter, so as to fine-tune the stack for achieving a desired performance from the stack. For example, while in a stack, a TSV in a chip in the stack may be deactivated to reconfigure a 3D critical path thereby improving a delay value of a timing performance parameter of the stack.

Figure 4:
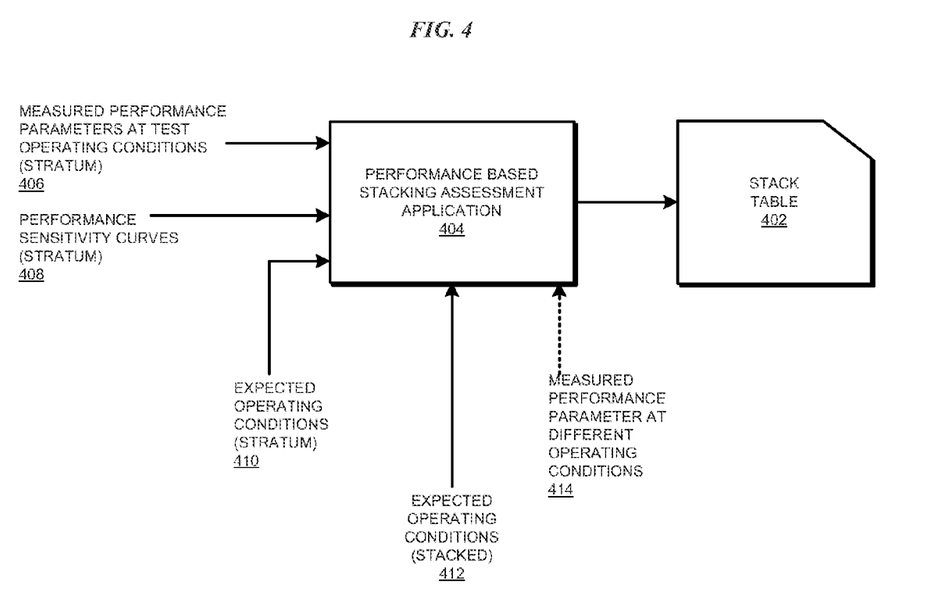
FIG. 4 depicts a block diagram of an example configuration to create a stack table in accordance with an illustrative embodiment.

With reference to FIG. 4, this figure depicts a block diagram of an example configuration to create a stack table in accordance with an illustrative embodiment.

Performance-based stacking assessment application 404 may be implemented in application 105 in FIG. 1. Alternatively, application 404 may be implemented as a part of an existing IC design tool.

Stack table 402 stores critical path information about the design of a given chip. In other words, table 402 can be referenced to find out which critical paths exists in the design of the given chip, and some or all of them can be selected as potential 3D critical paths for performing 3D stacked performance characterization as described with respect to FIG. 3. Table 402 may also provide desirable delay configurations and estimated stack temperatures for the regions corresponding to the critical paths on the chip.

Stack table 402 further stores design-stage estimates of performance of critical paths, other components of the design, or the design as a whole, under certain operating conditions. For example, table 402 may contain several entries for a critical path, each entry describing the performance of the critical path under different operating conditions of temperature, clock (frequency), and voltage.

In one embodiment, one or more performance tests may be performed at certain standard operating conditions, and the remaining entries may be extrapolated from the results of these performance tests using known performance sensitivity curves. In another embodiment, each entry may result from actual testing under the operating conditions represented in those entries. In another embodiment, some entries may be a result of actual testing under certain operating conditions, and some may be extrapolated using performance sensitivity curves.

In order to populate stack table 402 in any of these manners, application 404 accepts as input measured performance at test operating conditions 406. Measured performance 406 is a result of performance testing on the chip under the test operating conditions with the chip in a single stratum configuration.

Application 404 further accepts as input, performance sensitivity curves 408. Performance sensitivity curves 408 are also applicable to the subject chip in a single stratum configuration.

Application 404 may accept any number of further inputs to populate stack table 402 with any number of operating condition entries. For example, application 404 may accept an input that includes expected operating conditions 410 when the chip is in a single stratum configuration. Application 404 may accept an input that includes expected operating conditions 412 when the chip is in a stacked configuration.

As described above, optionally, application 404 may accept one or more inputs that include measured performance at varying operating conditions 414. Measured performance 414 may be the result of actual performance testing on the chip under different operating conditions with the chip in a single stratum configuration.

As will be described in more detail with respect to FIG. 5, stack table 402 may include many additional data items. Some data items in stack table 402 may provide other types of performance characteristics, such as leakage current change, under varying operating conditions in (hypothetically) stacked or single stratum configurations. Some data items in stack table 402 may correlate certain chip's performance characteristics with proximity to other chips or layers. Some data items in stack table 402 may provide pre-computed signal values to use for the signals to be sent from a controller, such as controller 314 in FIG. 3, to a multiplexer, such as multiplexer 316 in FIG. 3, as described with respect to FIG. 3.

To describe the process of using stack table 402 (lookup) by way of an example, consider that the performance characteristic being measured and stored in stack table 402 is a delay value pertaining to a critical path in a chip C1 that is a candidate for stacking. Using the signal data stored in an entry in stack table 402, or computing the signal data using other information stored in stack table 402, a controller, such as controller 314 in FIG. 3, activates certain critical path sensors in the chip. For all candidate chips C1 to Cx, application 404 computes combined delay D as follows:

$$D = \text{Wire Delay Component} + \text{Logic Delay Component} + 3D \text{ Structure component}$$

Wire delay component=back-end delay+activated TSV delays

Logic delay component=delay of logic components in the front-end macro in the critical path being tested Delay value D is computed for various expected operating conditions at various expected chip stacking configurations, using performance sensitivity curves, and proximity sensitivity to other chips. Note that no actual stacking is performed and no stacking configuration is committed to perform these computations using application 404.

Various delay values computed and/or measured in this manner are populated in stack table 402 or another suitable location. Delays from various critical paths can be normalized or cumulated as necessary to gain a measure of the chip's delay (timing performance characteristic) when the chip is in a corresponding 3D stack. Based on the delay characteristics of various chips when they are proximate to other chips in a corresponding 3D stack, application 404 can select one or more stacking solutions that will not cause a delay threshold set for a stack to be exceeded.

The above operation is described with respect to delay (timing performance characteristic) only as an example for the clarity of the description of the configuration of FIG. 4 and is not intended to be limiting on the invention. Stack table 402 can be used, and other performance characteristic, such as temperature, total leakage current, or power consumption, can be computed in application 404 in a similar manner within the scope of the invention. Many other similarly computable performance characteristics will be apparent from this disclosure to those of ordinary skill in the art and the same are contemplated within the scope of the invention. Furthermore, different 3D stacked performance characterizations may require different algorithms and different sensitivity information inputs in application 404 and application 404 may be configured accordingly without departing the scope of the invention.

Figure 5:
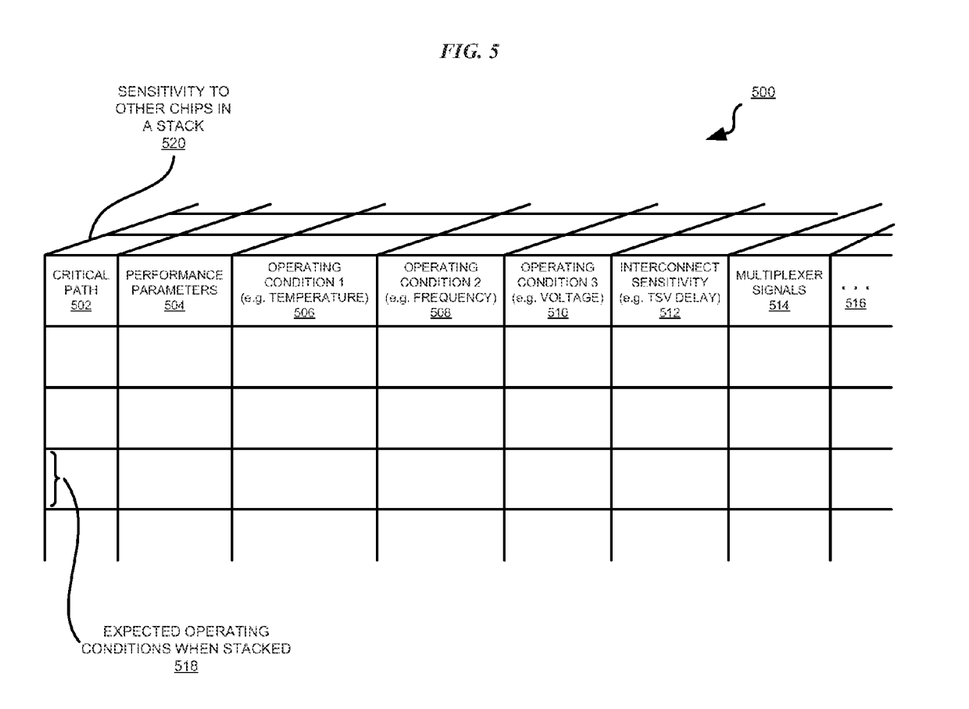
FIG. 5 depicts a block diagram of an example bonding table layout in accordance with an illustrative embodiment.

With reference to FIG. 5, this figure depicts a block diagram of an example stack table layout in accordance with an illustrative embodiment. Table 500 may be used as stack table 402 in FIG. 4.

An implementation of stack table 500 may implement the table in any number of dimensions. For a given candidate chip for stacking, as an example, table 500 correlates different combinations of values in columns 502, 504, 506, 508, 510, 512, and 514 as various rows. Row 518 is an example row. Table 500 further correlates those rows for that given candidate chip with sensitivity of other chips in various expected stack configurations as planes 520. Other correlations may be similarly represented as planes in the fourth, fifth, or n-th dimension of table 500 within the scope of the invention.

As an example, column 502 lists the various critical paths in the given candidate chip. The critical paths listed under column 502 may be cross-stratum critical paths as determined during the design of the chip without actually placing the chip in a 3D stack. Column 504 lists the various performance parameters (measured, or extrapolated from single stratum design data) for one or more critical paths in the given candidate chip.

In other embodiments specialized types of performance metrics can be used for the target design parameters in a similar way. These specialized performance parameters include but are not limited to energy performance parameters, power consumption or dissipation performance parameters, and reliability performance parameters.

Columns 506-510 list the various operating conditions considered in determining the performance parameters for one or more critical paths in the given candidate chip. Temperature, frequency, and voltage are depicted only as example operating conditions in table 500 without implying a limitation on the invention.

Column 512 lists the various interconnect sensitivities, e.g., delays introduced by the various TSVs used/usable in one or more critical paths in the given candidate chip that were considered, activated, or measured in determining the corresponding performance parameter values in a row. Optionally, signal values to be used for the signals sent from a controller in the infrastructure on the chip to a multiplexer, sensor, or both in the infrastructure on the chip may be predetermined and stored in column 514.

In one embodiment, a controller in the infrastructure on the chip may compute the signal values and column 514 may be eliminated or modified to enable such on-controller computation of signals. For example, a modified column 514 may include a formula or a reference to an algorithm to be used for such on-controller computation. As another example, column 514 may be eliminated from stack table 500 when the controller is able to compute the signal values by reference to other data stored in table 500 or elsewhere.

Row 518 is an example row in table 500 that stores the performance parameter values for a critical path in a given chip for operating conditions that would be expected when the chip is stacked. Plane 520 stores the values of the various combinations of columns 502-516 and the corresponding rows, as they are affected by the given candidate chip's sensitivity to other proximate chips in a contemplated stack.

The specific columns, rows, and planes depicted in FIG. 5 are only non-limiting examples. Many other factors, such as additional operating conditions, sensitivities, signal values, or signal computation formulae/algorithms may be stored in additional columns, such as in columns 516 et seq., rows, planes, or dimensions.

Figure 6:
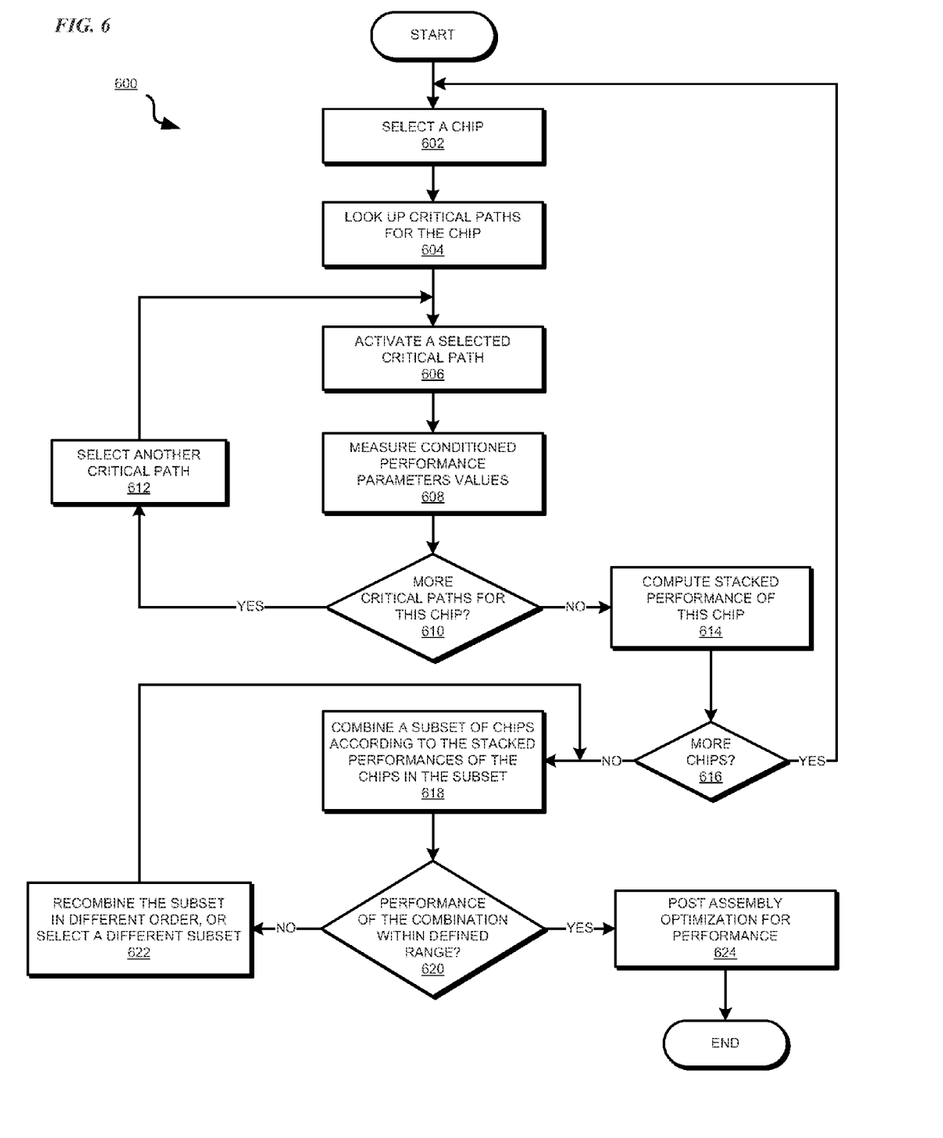
FIG. 6 depicts a flowchart of an example process for performance-based chip-to-chip stacking in accordance with an illustrative embodiment.

With reference to FIG. 6, this figure depicts a flowchart of an example process for performance-based chip-to-chip stacking in accordance with an illustrative embodiment. Process 600 may be implemented in application 404 in FIG. 4.

Process 600 begins by selecting a chip that is a candidate for stacking (step 602). Process 600 looks up the critical paths for the selected chip, such as from stack table 500 in FIG. 5 (step 604).

Process 600 selects and activates a critical path, such as by using components of the infrastructure on the chip as described elsewhere in the disclosure (step 606). The activation of the critical path includes activating any TSVs that are not normally activated when the chip is configured as single stratum, but would be used when the chip is stacked in a 3D multi-strata stack.

Process 600 measures the desired performance parameter value, e.g., a combined delay, using the activated critical path (step 608). Before performing the measurement of step 608, process 600 may set the operating conditions (not shown) as will be expected when the chip is operated in a stacked configuration. Any values of the performance parameter for operating conditions other than the expected operating conditions may also be extrapolated (not shown) in process 600 as described elsewhere in the disclosure.

Process 600 determines whether more critical paths remain to be similarly assessed for 3D stacked performance characterization (step 610). If more critical paths remain ("Yes" path of step 610), process 600 selects another critical path, such as from stack table500 in FIG. 5 (step 612). Process 600 then returns to step 606.

If no more critical paths remain, ("No" path of step 610), process 600 computes the 3D stacked performance of the candidate chip (step 614). In some cases, additional critical paths may exist in the chip but they may not be a factor in the stacking. Accordingly, if no more critical paths have to be assessed, even if some remain in the stack table, process 600 may proceed from step 610 to step 614.

Process 600 determines whether more candidate chips for stacking remain to be assessed for 3D stacking performance characteristics (step 616). If more candidate chips have to be assessed ("Yes" path of step 616), process 600 returns to step 602 and selects another candidate chip.

If no more candidate chips have to be assessed for the contemplated stacking ("No" path of step 616), process 600 combines a subset of the candidate chips according to the stacked performances computed in step 614 for the chips in the subset (step 618). For example, process 600 may combine the candidate chips in the selected subset in a particular order in the stack in step 618.

Process 600 determines whether the performance of the combination, to with, the value of a give performance parameter of the stack as ordered using the subset of candidate chips, is within a defined range of values (step 620). If not ("No" path of step 620), process 600 may either recombine the selected subset of candidate chips in a different order, or select a different subset of chips to stack (step 622). Process 600 then returns to step 618.

If the performance of the combination is within the defined range ("Yes" path of step 620), process 600 may optionally perform post-assembly optimization (step 624). Process 600 ends thereafter. Step 624 may be implemented for fine-tuning the stack's performance after the stack is committed, using the same infrastructure on the stacked chips in the manner described elsewhere in the disclosure. For example, in one embodiment, individual layer controllers may communicate with each other to determine an optimal stack configuration for the given set of layer characteristics and ordering in the post-bonding stage.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for performance-based chip-to-chip stacking. Using an embodiment of the invention, a stack's performance can be determined prior to committing the chips to a stack.

An embodiment may improve the stack's performance without having to commit and perform post-commit manipulations of the stack. For example, an inherently hot chip may be selected as a candidate chip for a stack, but a suitable position in the stack can be determined for that chip before performing the stacking such that the chip's temperature remains within the allowed tolerances. An embodiment may also improve the power consumption and other performance parameters of the stacked design. An embodiment may be implemented to use rules or policies for the stacking in addition to the single stratum design-time information about the candidate chips.

The various embodiments have been described with respect to performance-based stacking using certain performance parameters only as a generic example. Many types of performance considerations for optimizing a stack will be apparent from this disclosure to those of ordinary skill in the art and the same are contemplated within the scope of the invention. For example, within the scope of the invention, an implementation of an embodiment may be based on an energy parameter, such as for minimizing the overall energy consumption or energy loss. In other words, an implementation may focus on energy performance of the stack as the performance of concern within the scope of the invention.

As another example, within the scope of the invention, an implementation of an embodiment may be based on a reliability parameter, such as for improving the reliability performance of the resulting stack even if the stack is relatively energy inefficient or of suboptimal performance. In other words, an implementation may focus on reliability performance of the stack as the performance of concern within the scope of the invention.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method for performance-based chip-to-chip stacking, the method comprising:
    selecting a first candidate chip from a set of candidate chips for stacking, each candidate chip in the set of candidate chips including an integrated circuit;
    activating a part of a 3D performance determinant in the first candidate chip;
    measuring a value of a performance parameter of the first candidate chip for a set of operating conditions;
    computing, using a processor and a memory, a stacked performance value for the first candidate chip using the value; and
    stacking a subset of the set of candidate chips in a stack, the subset including the first candidate chip, such that a combined value of the performance parameter for the subset when stacked in a first order is within a defined range of values for the performance parameter.

2. The computer implemented method of claim 1, wherein the part of the 3D performance determinant is a part of a selected critical path in the first candidate chip, further comprising:
    determining a set of critical paths in the first candidate chip by referencing a stack table, wherein the selected critical path is selected from the set of critical path, and wherein the set of critical paths included in the stack table is determined at design time for the first candidate chip in a single stratum configuration.

3. The computer implemented method of claim 2, further comprising:
    enabling a plurality of controllers in a plurality of chip in the subset to communicate with each other;
    populating the stack table with post-stacking characterization information; and
    determining, after stacking, an optimal configuration of the stack using the plurality of controllers and the stack table including the post-stacking characterization information.

4. The computer implemented method of claim 1, wherein the activating operation activates a cross-stratum interconnect that is not used when the first candidate chip is used in a single stratum configuration.

5. The computer implemented method of claim 4, wherein the activating is performed using an infrastructure fabricated on the first candidate chip.

6. The computer implemented method of claim 5, wherein the infrastructure includes a controller, a sensor, and a multiplexer, and wherein the controller transmits a signal the multiplexer to activate the cross-stratum interconnect.

7. The computer implemented method of claim 6, wherein a value of the signal is one of (i) stored in a stack table, and (ii) computed by the controller.

8. The computer implemented method of claim 1, further comprising:
    configuring the operating conditions in the set of operating conditions to correspond to the expected operating conditions when the first candidate chip is stacked in a chip-to-chip 3D stack, and wherein the performance parameter is a combined delay of the selected critical path as activated.

9. The computer implemented method of claim 1, further comprising:
    computing an additional value of the performance parameter using the value, a performance sensitivity curve, and a sensitivity to a second candidate chip.

10. The computer implemented method of claim 1, wherein the stacked performance value further uses a second value for the performance parameter determined for a second critical path in the first candidate chip.

11. The computer implemented method of claim 1, wherein when the combined value is not within the defined range, further comprising:
    reordering the stack in a second order to bring the combined value within the defined range.

12. The computer implemented method of claim 1, wherein when the combined value is not within the defined range, further comprising:
    selecting a second subset of the set of candidate chips, the second subset including the first candidate chip; and
    stacking the second subset in a second stack according to a second order.

13. The computer implemented method of claim 1, further comprising:
    performing an adjustment in the stack using the infrastructure on the first candidate chip to fine-tune the combined value of the performance parameter.

14. The computer implemented method of claim 13, wherein the stack has been committed at the time the adjustment is performed.

15. A computer usable program product comprising a computer usable storage device including computer usable code for performance-based chip-to-chip stacking, the computer usable code comprising:
    computer usable code for selecting a first candidate chip from a set of candidate chips for stacking, each candidate chip in the set of candidate chips including an integrated circuit;
    computer usable code for activating a part of a 3D performance determinant in the first candidate chip;
    computer usable code for measuring a value of a performance parameter of the first candidate chip for a set of operating conditions;
    computer usable code for computing a stacked performance value for the first candidate chip using the value; and
    computer usable code for stacking a subset of the set of candidate chips in a stack, the subset including the first candidate chip, such that a combined value of the performance parameter for the subset when stacked in a first order is within a defined range of values for the performance parameter.

16. The computer usable program product of claim 15, wherein the part of the 3D performance determinant is a part of a selected critical path in the first candidate chip, further comprising:
    computer usable code for determining a set of critical paths in the first candidate chip by referencing a stack table, wherein the selected critical path is selected from the set of critical path, and wherein the set of critical paths included in the stack tableis determined at design time for the first candidate chip in a single stratum configuration.

17. The computer usable program product of claim 15, wherein the computer usable code for activating activates a cross-stratum interconnect that is not used when the first candidate chip is used in a single stratum configuration.

18. The computer usable program product of claim 15, wherein the computer usable code is stored in a computer readable storage medium in a data processing system, and wherein the computer usable code is transferred over a network from a remote data processing system.

19. The computer usable program product of claim 15, wherein the computer usable code is stored in a computer readable storage medium in a server data processing system, and wherein the computer usable code is downloaded over a network to a remote data processing system for use in a computer readable storage medium associated with the remote data processing system.

20. A data processing system for performance-based chip-to-chip stacking, the data processing system comprising:

a storage device including a storage medium, wherein the storage device stores computer usable program code; and a processor, wherein the processor executes the computer usable program code, and wherein the computer usable program code comprises:

computer usable code for selecting a first candidate chip from a set of candidate chips for stacking, each candidate chip in the set of candidate chips including an integrated circuit;

computer usable code for activating a part of a 3D performance determinant in the first candidate chip;

computer usable code for measuring a value of a performance parameter of the first candidate chip for a set of operating conditions;

computer usable code for computing a stacked performance value for the first candidate chip using the value; and computer usable code for stacking a subset of the set of candidate chips in a stack, the subset including the first candidate chip, such that a combined value of the performance parameter for the subset when stacked in a first order is within a defined range of values for the performance parameter.

* * * * *